(12) United States Patent  
Okada

(10) Patent No.: US 6,222,475 B1  
(45) Date of Patent: Apr. 24, 2001

(54) THREE-STEP CONVERTER

(75) Inventor: Kouji Okada, Kasugai (JP)

(73) Assignees: Fujitsu Limited, Kawasaki; Fujitsu VLSI Limited, Kasugai, both of (JP)

( * ) Notice: Subject to any disclaimer, the term of this patent is extended or adjusted under 35 U.S.C. 154(b) by 0 days.

(21) Appl. No.: 08/583,960

(22) Filed: Jan. 11, 1996

Related U.S. Application Data

(63) Continuation of application No. 08/140,558, filed on Oct. 25, 1993, now abandoned.

(30) Foreign Application Priority Data

Mar. 10, 1993 (JP) .................................. 5-049654

(51) Int. Cl.[7] .................................................. H03M 1/14
(52) U.S. Cl. ............................................................ 341/156
(58) Field of Search ............................................. 341/156

(56) References Cited

U.S. PATENT DOCUMENTS

| | | | |
|---|---|---|---|
| 4,542,370 | * 9/1985 | Yamada et al. ...................... | 341/156 |
| 4,612,531 | * 9/1986 | Dingwall et al. .................... | 341/156 |
| 4,816,831 | * 3/1989 | Mizoguchi et al. ................. | 341/156 |
| 4,893,124 | * 1/1990 | Tsuji et al. .......................... | 341/156 |

FOREIGN PATENT DOCUMENTS

| | | | |
|---|---|---|---|
| 59-119921 | 7/1984 | (JP) ............................. | H03K/13/175 |
| 3-234123 | 10/1991 | (JP) .............................. | H03M/1/14 |

OTHER PUBLICATIONS

IEEE–ISSCC, Report No. WAM 3.6—"A Monolithic 8b Two–Step Parallel ADC Without DAC and Subtractor Circuits," pp. 46–47, 290, Feb. 10, 1982.

* cited by examiner

*Primary Examiner*—Howard L. Williams  
(74) *Attorney, Agent, or Firm*—Staas & Halsey LLP

(57) ABSTRACT

The present invention provides an A/D converter. An upper comparison voltage generator divides a reference voltage into a plurality of large-level regions with series-connected first voltage-dividing elements, and outputs voltages at boundaries of the individual large-level regions as upper comparison voltages. Upper comparators compare an analog input voltage with the individual upper comparison voltages. An upper encoder determines, from output signals of the upper comparators, to which one of the large-level regions the analog input voltage belongs, and outputs a predetermined upper digital code corresponding to the determined large-level region. A lower comparison voltage generator divides the large-level region to which the analog input voltage is determined to belong by the upper encoder, into a plurality of small-level regions with second voltage-dividing elements and outputs voltages at boundaries of the individual small-level regions as lower comparison voltages. Lower comparators compare the analog input voltage with the individual lower comparison voltages. A lower encoder determines, from output signals of the lower comparators, to which one of the small-level regions the analog input voltage belongs, and outputs a predetermined lower digital code corresponding to the determined small-level region.

2 Claims, 14 Drawing Sheets

| CM15 | CM14 | CM13 | en13 | en12 |
|------|------|------|------|------|
| 1 | 1 | 1 | 1 | 1 |
| 0 | 1 | 1 | 1 | 0 |
| 0 | 0 | 1 | 0 | 1 |
| 0 | 0 | 0 | 0 | 0 |

| CM23 | CM24 | CM25 | en12 | en23 | en22 |
|------|------|------|------|------|------|
| 1 | 1 | 1 | 1 | 1 | 1 |
| 0 | 1 | 1 | 1 | 1 | 0 |
| 0 | 0 | 1 | 1 | 0 | 1 |
| 0 | 0 | 0 | 1 | 0 | 0 |
| 1 | 1 | 1 | 0 | 1 | 1 |
| 1 | 1 | 0 | 0 | 1 | 0 |
| 1 | 0 | 0 | 0 | 0 | 1 |
| 0 | 0 | 0 | 0 | 0 | 0 |

| CM32 | CM31 | CM30 | en10 | en31 | en30 |
|------|------|------|------|------|------|
| 1 | 1 | 1 | 1 | 1 | 1 |
| 0 | 1 | 1 | 1 | 1 | 0 |
| 0 | 0 | 1 | 1 | 0 | 1 |
| 0 | 0 | 0 | 1 | 0 | 0 |
| 1 | 1 | 1 | 0 | 1 | 1 |
| 1 | 1 | 0 | 0 | 1 | 0 |
| 1 | 0 | 0 | 0 | 0 | 1 |
| 0 | 0 | 0 | 0 | 0 | 0 |

Fig. 16

| en13 | en12 | $S_A$ | $S_B$ | $S_C$ | $S_D$ |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

Fig. 18

| en12 | en23 | en22 | $S_E$ | $S_F$ | $S_G$ | $S_H$ |
|---|---|---|---|---|---|---|
| 0 | 0 | 0 | 1 | 0 | 0 | 0 |
| 0 | 0 | 1 | 0 | 1 | 0 | 0 |
| 0 | 1 | 0 | 0 | 0 | 1 | 0 |
| 0 | 1 | 1 | 0 | 0 | 0 | 1 |
| 1 | 0 | 0 | 0 | 0 | 0 | 1 |
| 1 | 0 | 1 | 0 | 0 | 1 | 0 |
| 1 | 1 | 0 | 0 | 1 | 0 | 0 |
| 1 | 1 | 1 | 1 | 0 | 0 | 0 |

THREE-STEP CONVERTER

This application is a continuation of Ser. No. 08/140,558 filed Oct. 25, 1993, now abandoned.

BACKGROUND OF THE INVENTION

1. Field of the Invention

The present invention relates to an A/D converter for converting an analog signal into a digital signal.

2. Description of the Related Art

As the number of electronic devices which handle digital signal processing have greatly increased in recent times, there is a concomitant increase in the demand for A/D converters which convert analog signals into digital signals. A parallel comparison type (flash type) A/D converter, one type of A/D converter, needs $2^n-1$ comparators to acquire an n-bit digital output signal. As the number of bits in the digital output signal increases, the circuit scale increases exponentially. However a series-parallel comparison type (2-step parallel type) A/D converter needs fewer comparators, and thus can utilize a smaller circuit scale than the parallel comparison type A/D converter. Due to the recent increase in the number of bits in the digital output signal of A/D converters, there is a strong demand to make the circuit scale of the parallel comparison type A/D converter smaller.

The conventional 2-step parallel A/D converter is described in detail in IEEE-ISSCC, Report No. WAM-36, February 1982.

FIG. 1 is a circuit diagram showing the structure of the conventional 4-bit 2-step parallel A/D converter.

A high reference voltage $V_{RH}$ and a low reference voltage $V_{RL}$ are divided by the resistor string formed by 16 series-connected resistors R. Those resistors R have the same resistance. The resistor string is separated into four blocks B1 to B4 each consisting of four series-connected resistors R. The nodes between the blocks B1 and B2, B2 and B3, and B3 and B4 are connected to the inverting input terminals of associated comparators 10 to 12. Reference voltages V1 to V3 respectively output from those three nodes are input to the inverting input terminals of the associated comparators 10 to 12. The reference voltages V1 to V3 each have a value obtained by dividing the potential difference between the high reference voltage $V_{RH}$ and low reference voltage $V_{RL}$ by four.

Three nodes between the four resistors R, which constitute each of the blocks B1 to B4, are connected via an associated set of three switches $S_A$, $S_B$, $S_C$ or $S_D$ to the inverting input terminals of comparators 20 to 22. Reference voltages Va to Vc are respectively applied to the inverting input terminals of the comparators 20 to 22.

An analog input signal $A_{in}$ is input to the non-inverting input terminals of the individual comparators 10 to 12 and 20 to 22. The comparators 10 to 12 compare the associated reference voltages V1 to V3 with the analog input signal $A_{in}$. Each comparator 10, 11 or 12 outputs a signal of a low (L) level when the voltage level of the analog input signal $A_{in}$ becomes lower than that of the reference voltage V1, V2 or V3, and outputs a signal of a high (H) level when the voltage level of the analog input signal $A_{in}$ becomes higher than that of the reference voltage V1, V2 or V3. The output signals (thermometer codes) of the comparators 10 to 12 are input to a first encoder 40. The first encoder 40 determines to which one of four large-level regions the voltage level of the analog input signal $A_{in}$ belongs: region $V_{RB}$ to V1, V1 to V2, V2 to V3 and V3 to $V_{RL}$. Those four regions are acquired by dividing the potential difference between the high reference voltage $V_{RH}$ and low reference voltage $V_{RL}$ by four. The first encoder 40 encodes the result of the decision into a binary code and converts the binary code into a 2-bit digital output en11, en10.

Based on the digital output en11, en10, a switch control circuit (not shown) closes (enables) one set of switches $S_A$, $S_B$, $S_C$ or $S_D$ respectively corresponding to the first, second, third or fourth large-level region.

The reference voltages Va to Vc, obtained by further dividing the potential differences of the four large-level regions by four, are applied to the inverting input terminals of the associated comparators 20 to 22 via the closed switches $S_A$ to $S_D$. The comparators 20 to 22 compare the associated reference voltages Va to Vc with the analog input signal $A_{in}$. Each comparator 20, 21 or 22 outputs an L-level signal when the voltage level of the analog input signal $A_{in}$ becomes lower than that of the reference voltage Va, Vb or Vc, and outputs an H-level signal when the voltage level of the analog input signal $A_{in}$ becomes higher than that of the reference voltage Va, Vb or Vc. The output signals of the comparators 20 to 22 are input to a second encoder 50 having the same structure as the first encoder 40. The second encoder 50 determines to which one of four small-level regions the voltage level of the analog input signal $A_{in}$ belongs: reference voltage Va or above, between Va and Vb, between Vb and Vc, and Vc or below. These small-level regions are acquired by dividing the associated large-level regions by four. The second encoder 50 encodes the result of the decision into a binary code and converts the binary code into a 2-bit digital output en21, en20.

In the conventional 4-bit 2-step parallel A/D converter, as described above, the first A/D conversion is performed by the comparators 10 to 12 and the first encoder 40, yielding the upper 2-bit digital output en11, en10. Then, based on the digital output en11, en10, the switches $S_A$ to $S_D$ are switched over, and the second A/D conversion is performed by the comparators 20 to 22 and the second encoder 50, yielding the lower 2-bit digital output en21, en20.

FIG. 2 illustrates the circuit structure in the case where the aforementioned 4-bit 2-step parallel A/D converter is laid out on a semiconductor substrate. The resistors R and the switches $S_A$ to $S_D$ are laid out to form a rectangular pattern as a whole. The comparators 10 to 12 are arranged on the right side of the rectangle, with the first encoder 40 arranged outside the locations of the comparators. Arranged below the bottom side of the rectangle are the comparators 20 to 22 which perform the second A/D conversion. Arranged further outside the comparators 20 to 22 is the second encoder 50 which also performs the second A/D conversion. The layout on the substrate is given regularity by regularly arranging the comparators 10 to 12 and 20 to 22 and the encoders 40 and 50 around the regularly laid-out resistors R and switches $S_A$ to $S_D$.

If the comparator 11 shown in FIG. 2 is arranged to the left side of or above the rectangle formed by the resistors R and switches $S_A$ to $S_D$, wiring connecting the inverting input terminal of the comparator 11 and the node between the blocks B2 and B3 does not pass over the individual resistors R and switches $S_A$ to $S_D$, further facilitating the layout on the substrate. It should be noted that the order with which the voltages are applied to the inverting input terminals of the comparators 20 to 22 via the respective switches $S_A$ to $S_D$ in FIG. 2 differs from the order of the application of the voltages to the inverting input terminals of the comparators 20 to 22 via the respective switches $S_A$ to $S_D$ in FIG. 1. This is because the order with which the voltages are supplied to the comparators 20 to 22 in the first row (block B1) and the third row (block B3) of the resistor string is reverse to that in the second row (block B2) and the fourth row (block B4). Therefore, the second encoder 50 should be designed to reverse the order of the comparison results, which are output from the individual comparators 20 to 22 depending on which of the switches $S_A$ to $S_D$ is closed.

The 2-step parallel A/D converter shown in FIGS. 1 and 2 needs a sample and hold circuit, not shown, which samples and latches the analog input signal $A_{in}$ so that the level of the analog input signal $A_{in}$ will not vary during the two A/D conversions.

If the number of bits is increased in the 2-step parallel A/D converter, the circuit scale inevitably increases. For instance, a 6-bit 2-step parallel A/D converter needs 64 resistors R, 56 switches and 14 comparators. The structure of each encoder becomes complex and the circuit scale becomes about four times that of the 4-bit type. An 8-bit 2-step parallel A/D converter needs 265 resistors R, 240 switches and 30 comparators. Consequently the structure of each encoder becomes more complex and the circuit scale increases to about 16 times that of the 4-bit type. Moreover, the increase in the number of comparators also increases the power consumed in operating the A/D converter.

SUMMARY OF THE INVENTION

It is therefore an object of the present invention to provide a 2-step parallel A/D converter which is designed to minimize the circuit scale that is necessitated by increased multi-bit structure.

To achieve this object, according to the present invention, upper comparison voltage generating means divides a reference voltage into a plurality of large-level regions with series-connected first voltage-dividing elements and outputs voltages at boundaries of the individual large-level regions as upper comparison voltages. Upper comparators compare an analog input voltage with the individual upper comparison voltages. Upper determining means determines, from output signals of the upper comparators, to which one of the large-level regions the analog input voltage belongs, and by a further included convertor means outputs a predetermined upper digital code corresponding to the determined large-level region. Lower comparison voltage generating means divides the large-level region to which the analog input voltage is determined to belong by the upper determining means, into a plurality of small-level regions having second voltage-dividing elements and outputs voltages at boundaries of the individual small-level regions as lower comparison voltages. Lower comparators compare the analog input voltage with the individual lower comparison voltages. Lower determining means determines, from output signals of the lower comparators, to which one of the small-level regions the analog input voltage belongs, and by a further included comparison means outputs a predetermined lower digital code corresponding to the determined small-level region.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 16 is an explanatory diagram illustrating the function of the switch control circuit;

FIG. 18 is an explanatory diagram illustrating the function of this switch control circuit;

DETAILED DESCRIPTION OF THE PREFERRED EMBODIMENTS

Figure 3:
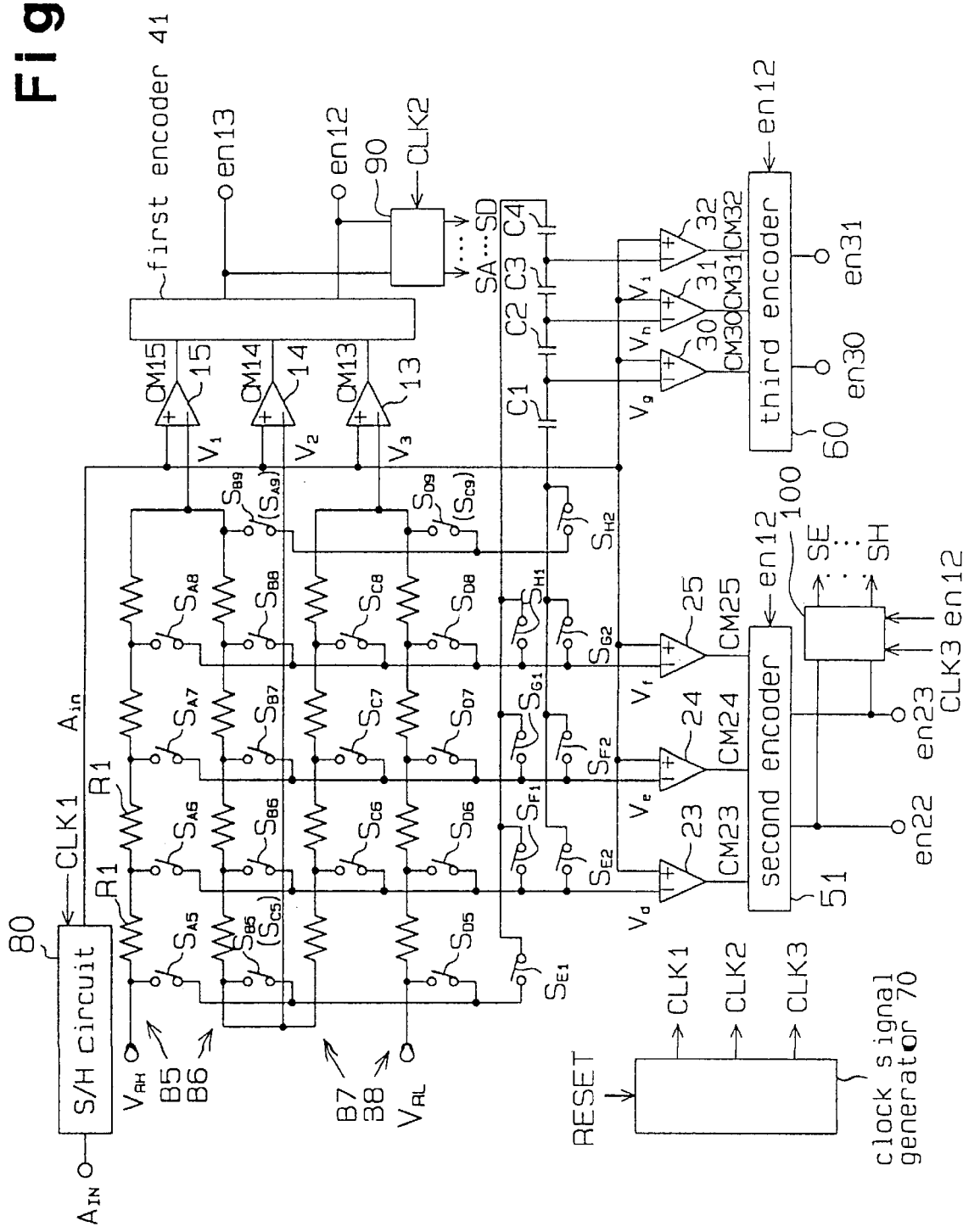
FIG. 3 is a circuit diagram showing a 6-bit A/D converter according to one embodiment of the present invention.

A 6-bit A/D converter according to a first embodiment of the present invention will now be described referring to FIGS. 3 to 19. As shown in FIG. 3, a high reference voltage $V_{RH}$ and a low reference voltage $V_{RL}$ are divided by the resistor string formed by 16 series-connected resistors R1. Those resistors R1 have the same resistance. The resistors R1 are separated into four blocks B5 to B8 each consisting of four resistors R1. The nodes between the blocks B5 and B6, B6 and B7, and B7 and B8 are connected to the inverting input terminals of associated comparators 15 to 13. Reference voltages V1 to V3 are respectively input to the non-inverting input terminals of the comparators 15 to 13. In each of the blocks B5 to B8, the left end of the leftmost resistors R1, the three nodes between the four resistors R1, and the right end of the rightmost resistor R1 are connected to a set of five switches $S_A$, $S_B$, $S_C$ and $S_D$, respectively for each block. Left end switches $S_{A5}$, $S_{B5}$, $S_{C5}$ and $S_{D5}$ of the four sets of switches $S_A$, $S_B$, $S_C$ and $S_D$ are connected via a switch $S_{E1}$ to a capacitor C4. Right end switches $S_{A9}$, $S_{B9}$, $S_{C9}$ and $S_{D9}$ of the switch sets $S_A$, $S_B$, $S_C$ and $S_D$ are connected via a switch $S_{B2}$ to a capacitor C1. As the switches $S_{B5}$ and $S_{C5}$, the switches $S_{A9}$ and $S_{B9}$, and the switches $S_{C9}$ and $S_{D9}$ are respectively connected in parallel, one switch in each parallel circuit also serves as the other switch for an adjacent parallel circuit.

Switches $S_{A6}$, $S_{B6}$, $S_{C6}$ and $S_{D6}$ of the individual sets of switches $S_A$, $S_B$, $S_C$ and $S_D$ are connected to the inverting input terminal of a comparator 23. The inverting input terminal of this comparator 23 is also connected via a switch $S_{F1}$ to the capacitor C4 and connected via a switch $S_{E2}$ to the capacitor C1. Switches $S_{A7}$, $S_{B7}$, $S_{C7}$ and $S_{D7}$ of the individual sets of switches $S_A$, $S_B$, $S_C$ and $S_D$ are connected to the inverting input terminal of a comparator 24. The inverting input terminal of this comparator 24 is also connected via a switch $S_{G1}$ to the capacitor C4 and is further connected via a switch $S_{F2}$ to the capacitor C1. Switches $S_{A8}$, $S_{B8}$, $S_{C8}$ and $S_{D8}$ of the individual sets of switches $S_A$, $S_B$, $S_C$ and $S_D$ are connected to the inverting input terminal of a comparator 25. The inverting input terminal of this comparator 25 is also connected via a switch $S_{H1}$ to the capacitor C4 and is further connected via a switch $S_{G2}$ to the capacitor C1. The sets of the switches $S_E$ to $S_H$ each consists of two switches. The reference voltages which are applied to the inverting input terminals of the individual comparators 23 to 25 are respectively expressed by Vd to Vf.

An analog input signal $A_{in}$ is input to the non-inverting input terminals of the individual comparators 15 to 13 via a sample and hold (S/H) circuit 80. The comparators 15 to 13 compare the associated reference voltages V1 to V3 with the analog input signal $A_{in}$. The individual comparators 15 to 13 output L-level signals CM15 to CM13 when the voltage level of the analog input signal $A_{in}$ becomes lower than those of the reference voltages V1 to V3. Comparators 15 to 13 output H-level signals CM15 to CM13 when the voltage level of the analog input signal $A_{in}$ becomes higher than those of the reference voltages V1 to V3. The output signals CM15 to CM13 of the comparators 15 to 13 are input to a first encoder 41. The first encoder 41 determines to which one of four large-level regions the voltage level of the analog input signal $A_{in}$ belongs: from $V_{RH}$ down to V1, from less than V1 down to V2, from less than V2 down to V3 and from less than V3 down to $V_{RL}$. These four regions are defined by the reference voltages V1 to V3. The first encoder 41 encodes the result of the decision into a binary code and converts the binary code into an upper 2-bit digital output en13, en12.

Based on the digital output en13, en12, a switch control circuit 90 closes or enables one set of switches $S_A$, $S_B$, $S_C$ or $S_D$ respectively corresponding to the large-level region of the analog input signal $A_{in}$. That is, the individual switches $S_{A5}$ to $S_{A8}$ in the switch set $S_A$ are closed simultaneously based on a control signal $S_A$ output from the switch control circuit 90. Likewise, the individual switches $S_{B5}$ to $S_{B8}$, $S_{C5}$ to $S_{C8}$, and $S_{D5}$ to $S_{D8}$ in the switch sets $S_B$, $S_C$ and $S_D$ respectively, are closed simultaneously based on respective control signals $S_B$ to $S_D$ output from the switch control circuit 90. The reference voltage Vd to Vf, obtained by further dividing the large-level regions of the analog input signal $A_{in}$ by four, are applied to the inverting input terminals of the associated comparators 23 to 25 via the closed switches $S_A$ to $S_D$. The analog input signal $A_{in}$ is input via the sample and hold (S/H) circuit 80 to the non-inverting input terminals of the comparators 23 to 25. The comparators 23 to 25 compare the associated reference voltages Vd to Vf with the analog input signal $A_{in}$. The individual comparators 23 to 25 output L-level signals CM23 to CM25 when the voltage level of the analog input signal $A_{in}$ becomes lower than those of the reference voltages Vd to Vf, and output H-level signals CM23 to CM25 when the voltage level of the analog input signal $A_{in}$ becomes higher than those of the reference voltages Vd to Vf.

The output signals CM23 to CM25 of the comparators 23 to 25 and the lower part, en12, of the aforementioned 2-bit digital output en13, en12 are input to a second encoder 51.

The second encoder 51 determines to which one of middle-level regions, acquired by dividing the large-level regions by four, the voltage level of the analog input signal $A_{in}$ belongs. The second encoder 51 encodes the result of the decision into a binary code and converts the binary code into a middle 2-bit digital output en23, en22. The middle-level regions are the reference voltage Vd or above, between Vd and Ve, between Ve and Vf, and Vf or below for the blocks B1 and B3, and are the reference voltage Vf or above, between Vf and Ve, between Ve and Vd, and Vd or below for the blocks B2 and B4.

A switch control circuit 100 closes one set of switches $S_E$, $S_F$, $S_G$ or $S_H$ corresponding to the middle-level region of the analog input signal $A_{in}$ based on the middle 2-bit digital output en23, en22 and the lower part, en12, of the upper 2-bit digital output en13, en12. That is, the individual switches $S_{E1}$ and $S_{E2}$ of the switch set $S_E$ are simultaneously closed based on a control signal $S_E$ from the switch control circuit 100. Likewise, the individual switches $S_{F1}$ and $S_{F2}$, $S_{G1}$ and $S_{G2}$, and $S_{H1}$ and $S_{H2}$ of the switch sets $S_F$, $S_G$ and $S_H$ are simultaneously closed based on respective control signals $S_F$, $S_G$ and $S_H$ from the switch control circuit 100.

Four capacitors C1 to C4 having the same capacitance are connected in series. The potential difference of the aforementioned middle-level region is applied to both ends of the series circuit of the capacitors C1 to C4 via the switches $S_E$ and $S_F$. The applied voltage is divided by four by the capacitors C1 to C4. The three nodes between the capacitors C1 to C4 are connected to the inverting input terminals of comparators 30 to 32. Accordingly, applied to the inverting input terminals of the comparators 30 to 32 are voltages Vg to Vi which are acquired by dividing the middle-level region of the reference voltage by four. The analog input signal $A_{in}$ is input to the non-inverting input terminals of the individual comparators 30 to 32 via the sample and hold (S/H) circuit 80. The comparators 30 to 32 compare the associated reference voltages Vg to Vi with the analog input signal $A_{in}$. The individual comparators 30 to 32 output L-level signals CM30 to CM32 when the voltage level of the analog input signal $A_{in}$ becomes lower than those of the reference voltages Vg to Vi, and output H-level signals CM30 to CM32 when the voltage level of the analog input signal $A_{in}$ becomes higher than those of the reference voltages Vg to Vi. The output signals CM30 to CM32 of the comparators 30 to 32 and the lower part, en12, of the upper 2-bit digital output en13, en12 are input to a third encoder 60. The third encoder 60 determines to which one of four small-level regions, obtained by dividing the middle-level region by four, the voltage level of the analog input signal $A_{in}$ belongs. The third encoder 60 encodes the result of the decision into a binary code and converts the binary code into a lower 2-bit digital output en31, en30. The small-level regions are the voltage Vg or above, between Vg and Vh, between Vh and Vi, and Vi or below when a higher potential than that of the capacitor C4 is supplied to the capacitor C1, and are the voltage Vi or above, between Vi and Vh, between Vh and Vg, and Vg or below when a higher potential than that of the capacitor C1 is supplied to the capacitor C4.

Figures 4, 5:
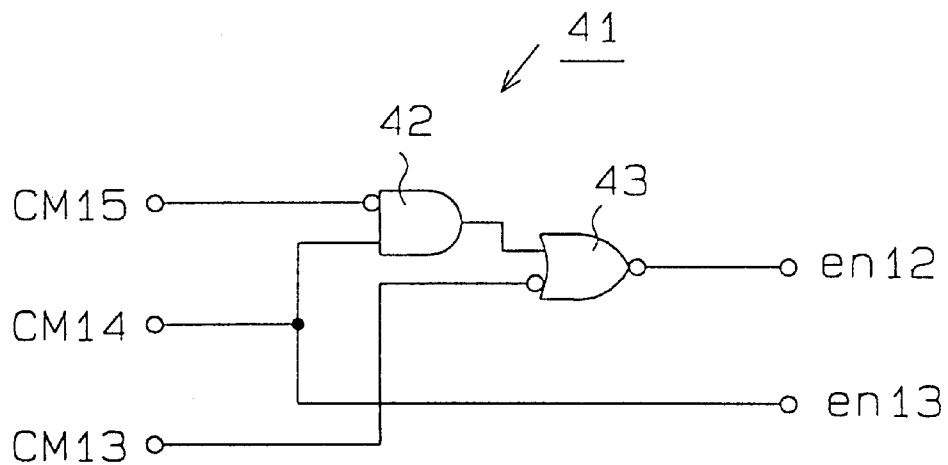
FIG. 4 is a circuit diagram showing a first encoder.
FIG. 5 is an explanatory diagram illustrating the function of the first encoder.
Figures 6, 7:
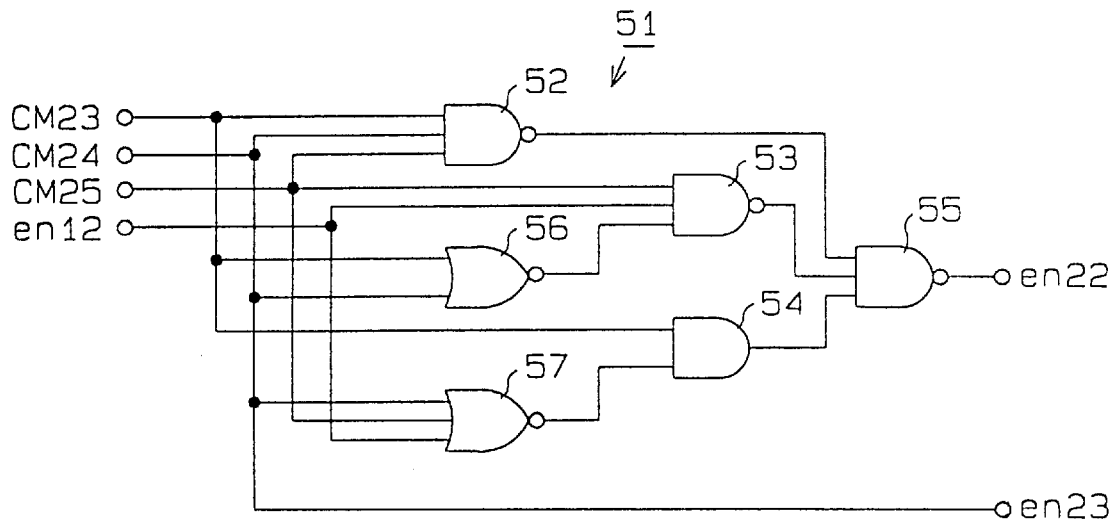
FIG. 6 is a circuit diagram showing a second encoder.
FIG. 7 is an explanatory diagram illustrating the function of the second encoder.
Figures 8, 9:
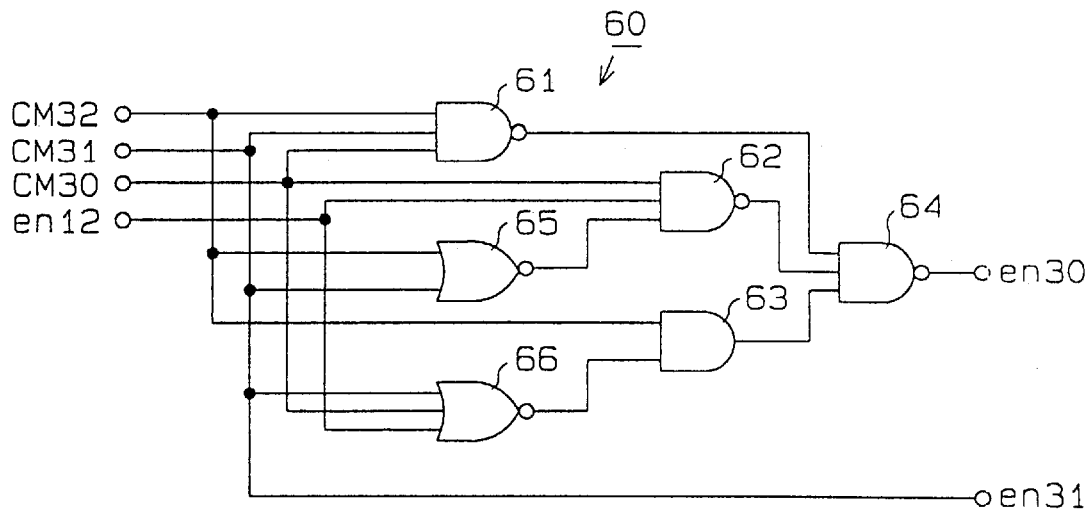
FIG. 8 is a circuit diagram showing a third encoder.
FIG. 9 is an explanatory diagram illustrating the function of the third encoder.

The first encoder 41 comprises an AND gate 42 and a NOR gate 43, as shown in FIG. 4, and outputs the digital signals en12 and en13 based on the output signals CM15 to CM13 output from the comparators 15 to 13 as shown in FIG. 5. The second encoder 51 comprises NAND gates 52 to 55 and NOR gates 56 and 57, as shown in FIG. 6, and outputs the digital signals en22 and en23 based on the output signals CM23 to CM25 output from the comparators 23 to 25 and the digital signal en12 as shown in FIG. 7. The third encoder 60 comprises NAND gates 61 to 64 and NOR gates 65 and 66, as shown in FIG. 8, and outputs the digital signals en30 and en31 based on the output signals CM30 to CM32 output from the comparators 30 to 32 and the digital signal en12 as shown in FIG. 9.

Figure 10:
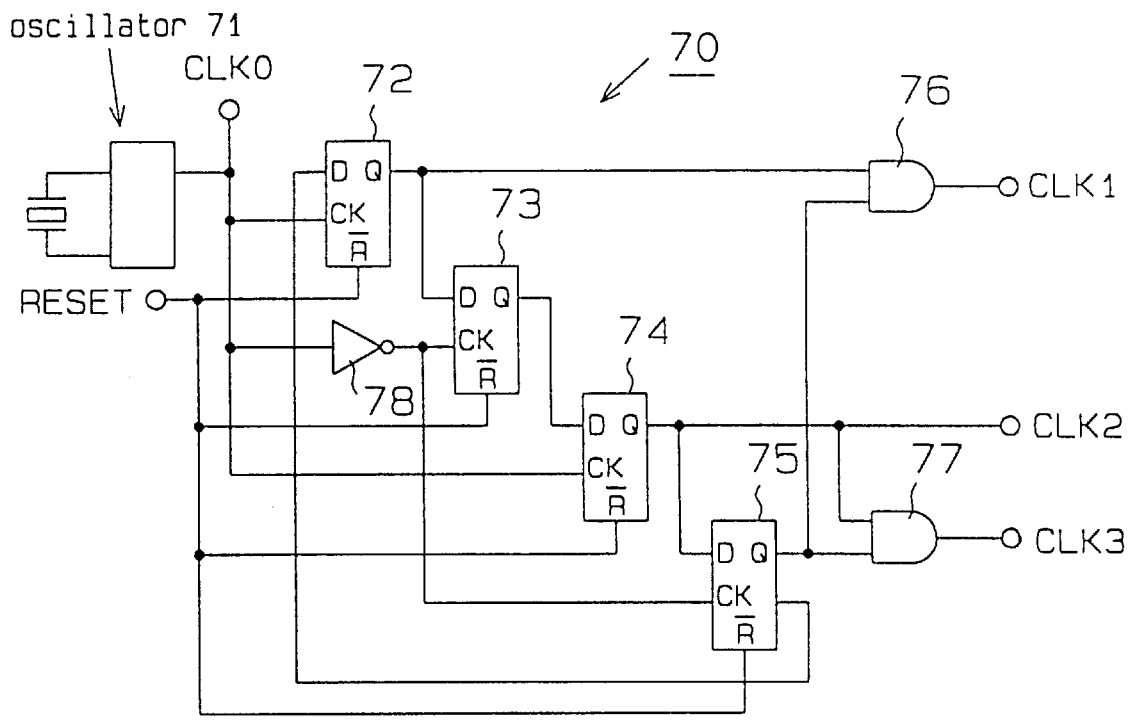
FIG. 10 is a circuit diagram showing a clock generator.

The aforementioned sample and hold circuit 80 and individual switch control circuits 90 and 100 operate in accordance with clock signals CLK1 to CLK3 output from a clock generator 70. As shown in FIG. 10, the clock generator 70 comprises a crystal oscillator 71, D flip-flops 72 to 75, AND gates 76 and 77 and an invertor 78. When receiving a reset signal RESET from outside, the clock generator 70 generates clock signals CLK1 to CLK3 shown in FIG. 12 based on a reference clock signal CLK0 output from the crystal oscillator 71.

Figure 11:
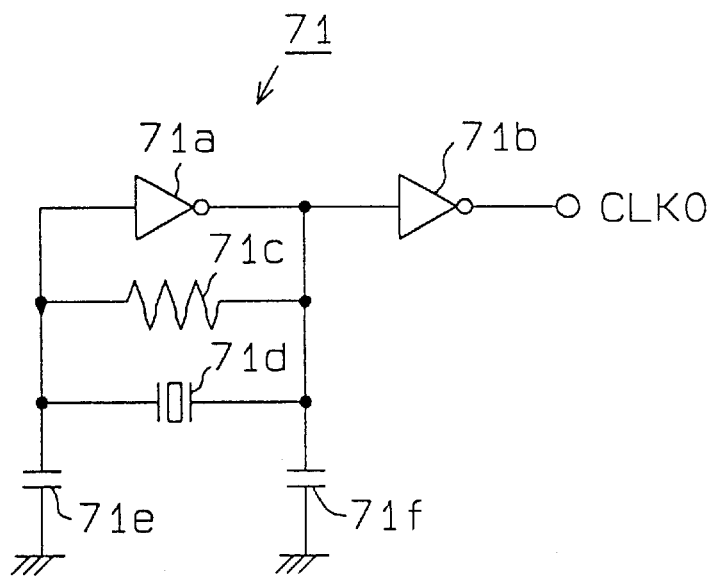
FIG. 11 is a circuit diagram showing a crystal oscillator.
Figure 12:
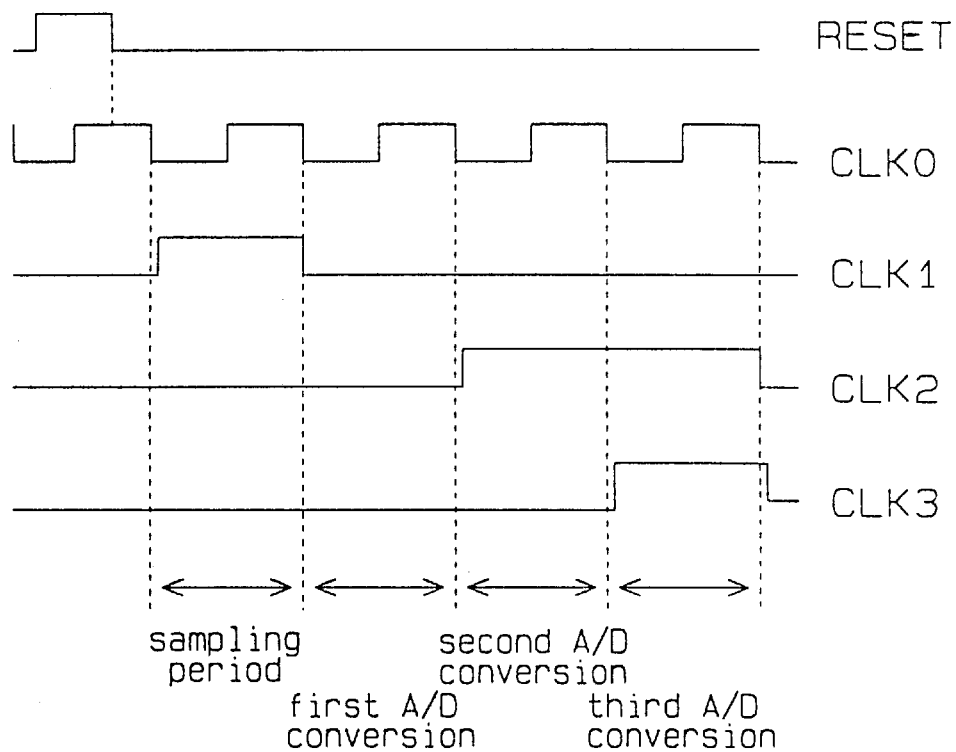
FIG. 12 is a waveform diagram illustrating the function of the clock generator.

As shown in FIG. 11, the crystal oscillator 71 comprises CMOS inverters 71a and 71b, a feedback resistor 71c, a crystal oscillator 71d and capacitors 71e and 71f. The crystal oscillator 71 amplifies the oscillation signal output from the crystal oscillator 71d and outputs the amplified signal as the reference clock signal CLK0. As shown in FIG. 12, after receiving the reset signal RESET from outside, the clock generator 70 first generates the clock signal CLK1 having a length of one period of the reference clock CLK0 from the crystal oscillator 71. Two periods after the rise of clock signal CLK1, the clock generator 70 generates the clock signal CLK2 having a length of two periods of the reference clock CLK0. Three periods after the rise of reference clock signal CLK0, the clock generator 70 generates the clock signal CLK3 having a length of one period of the reference clock CLK0.

Figure 13:
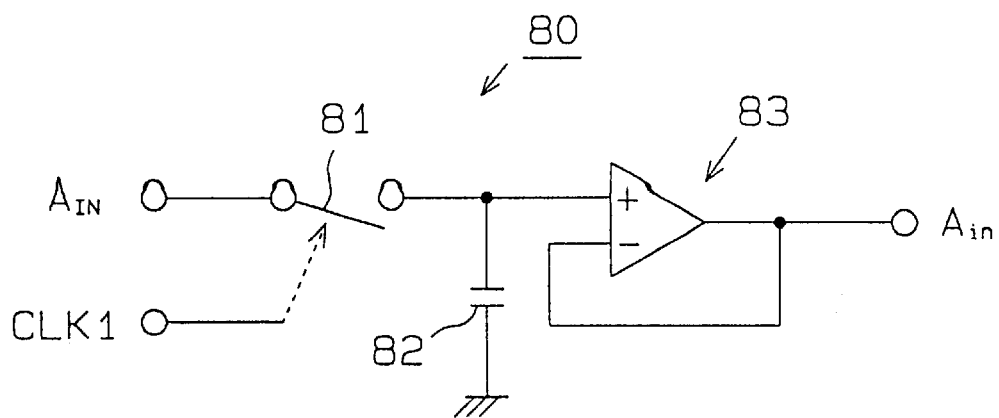
FIG. 13 is a circuit diagram showing a sample and hold circuit.

As shown in FIG. 13, the sample hold circuit 80 comprises a switch 81, whose switching operation is controlled by the clock signal CLK1, a capacitor 82 and a buffer amplifier 83. The buffer amplifier 83 is designed to have 100% feedback. When the clock signal CLK1 is input to the sample hold circuit 80, the switch 81 is closed, causing the capacitor 82 to be charged to the voltage level of the externally supplied analog input signal $A_{in}$. When the switch 81 is opened, the capacitor 82 holds the charged voltage level of the analog input signal $A_{in}$. The buffer amplifier 83 has a high input impedance, and thus prevents the discharging of the electric charges accumulated in the capacitor 82 so that the capacitor 82 can hold the voltage level of the analog input signal $A_{in}$. In short, the sample hold circuit 80 samples and holds the externally supplied analog input signal $A_{in}$ accordance with the clock signal CLK1, and supplies its output as the analog input signal $A_{in}$ to the non-inverting input terminals of the individual comparators 12 to 10, 20 to 22 and 30 to 32.

Figure 14:
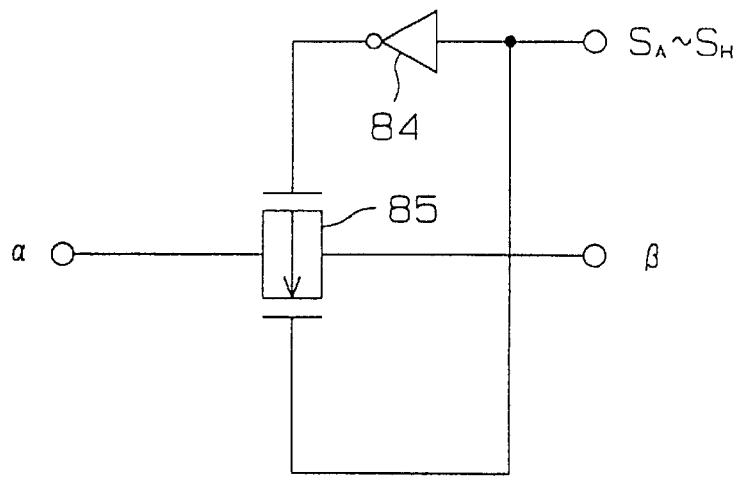
FIG. 14 is a circuit diagram showing the structure of a switch.
Figure 15:
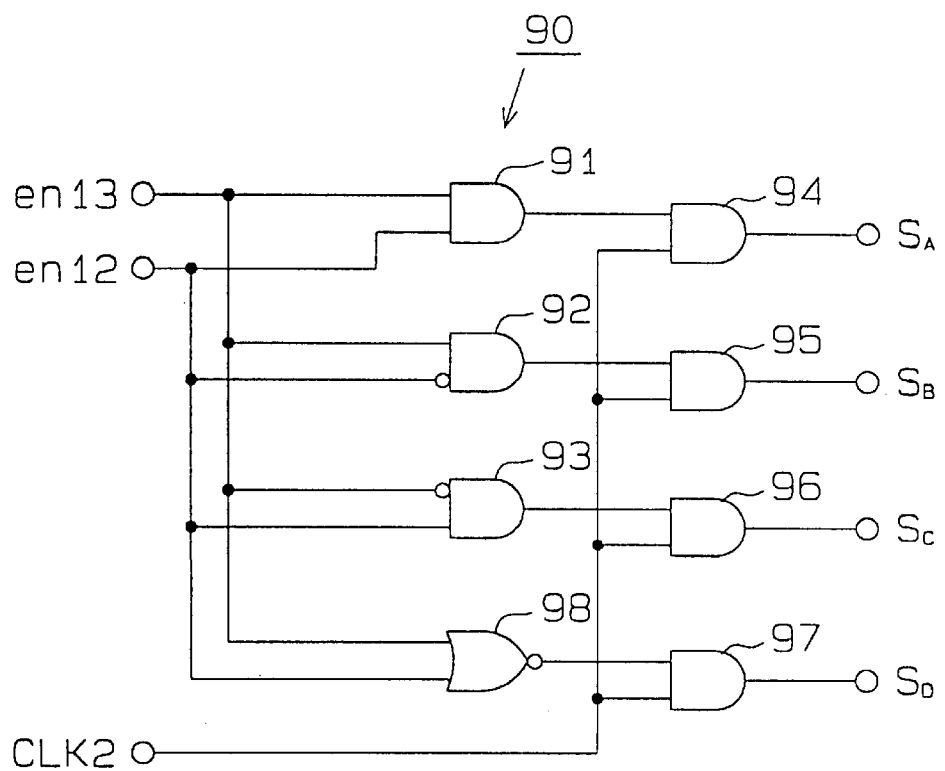
FIG. 15 is a circuit diagram showing a switch control circuit.
Figure 17:
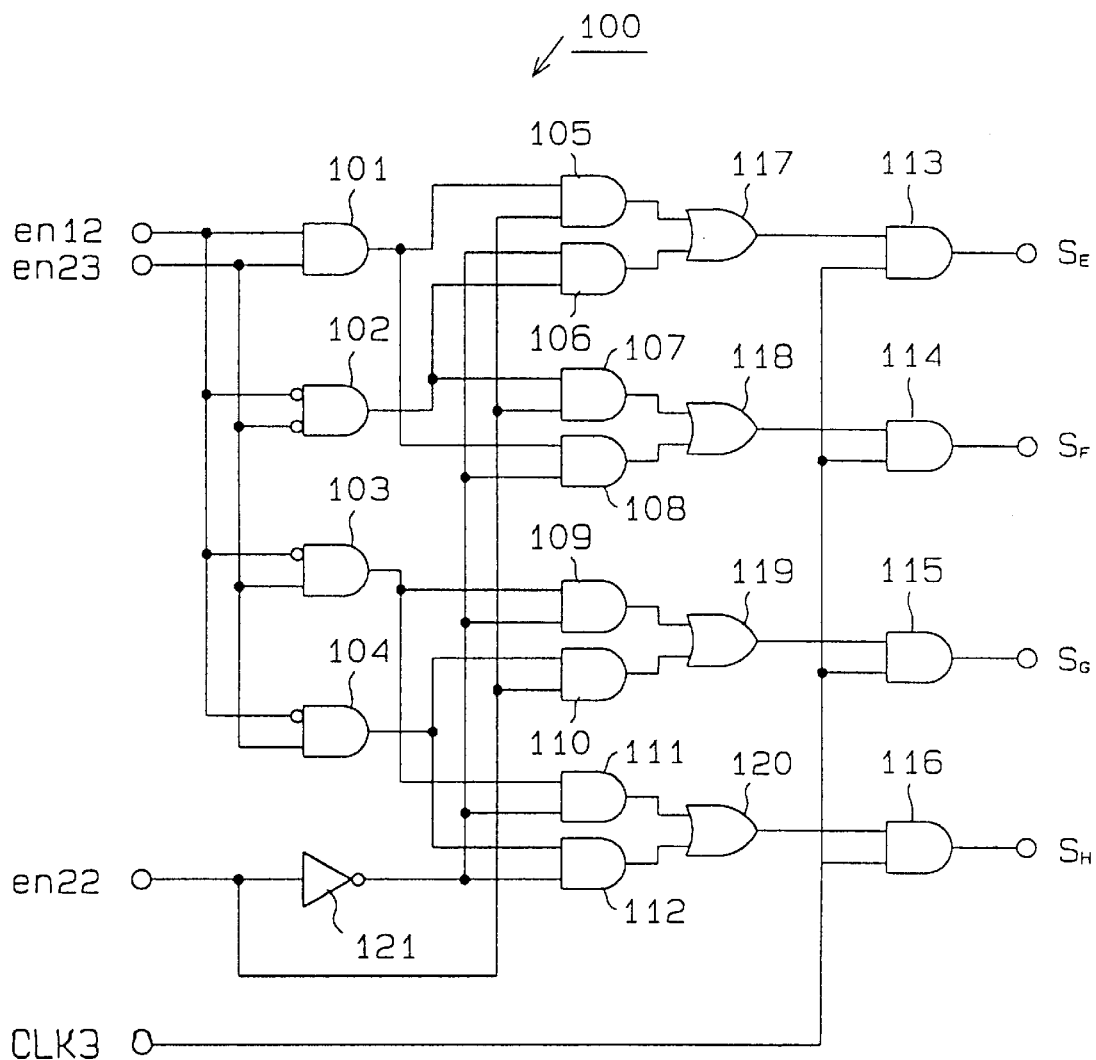
FIG. 17 is a circuit diagram showing another switch control circuit.

As shown in FIG. 14, each of the switches $S_A$ to $S_H$ is a well-known CMOS analog switch comprising a CMOS invertor 84 and a CMOS transfer gate 85. The individual switches $S_A$ to $S_H$ are closed based on the control signals $S_A$ to $S_H$ output from the switch control circuits 90 and 100, establishing a conductive state between terminals α and β of each switch. (For convenience, the reference characters of the switches $S_A$ to $S_H$ are used to denote the associated control signals.) The individual switches $S_A$ to $S_H$ are opened based on the control signals $S_A$ to $S_H$ output from the switch control circuits 90 and 100, establishing a non-conductive state between the terminals α and β of each switch. The switch control circuit 90 comprises AND gates 91 to 97 and a NOR gate 98, as shown in FIG. 15, and produces the control signals $S_A$ to $S_D$ shown in FIG. 16 based on the clock signal CLK2 and the digital signals en12 and en13. The switch control circuit 100 comprises AND gates 101 to 116, OR gates 117 to 120 and an invertor 121, as shown in FIG. 17, and produces the control signals $S_E$ to $S_H$ shown in FIG. 18 based on the clock signal CLK3 and the digital signals en12, en22 and en23.

Figure 19:
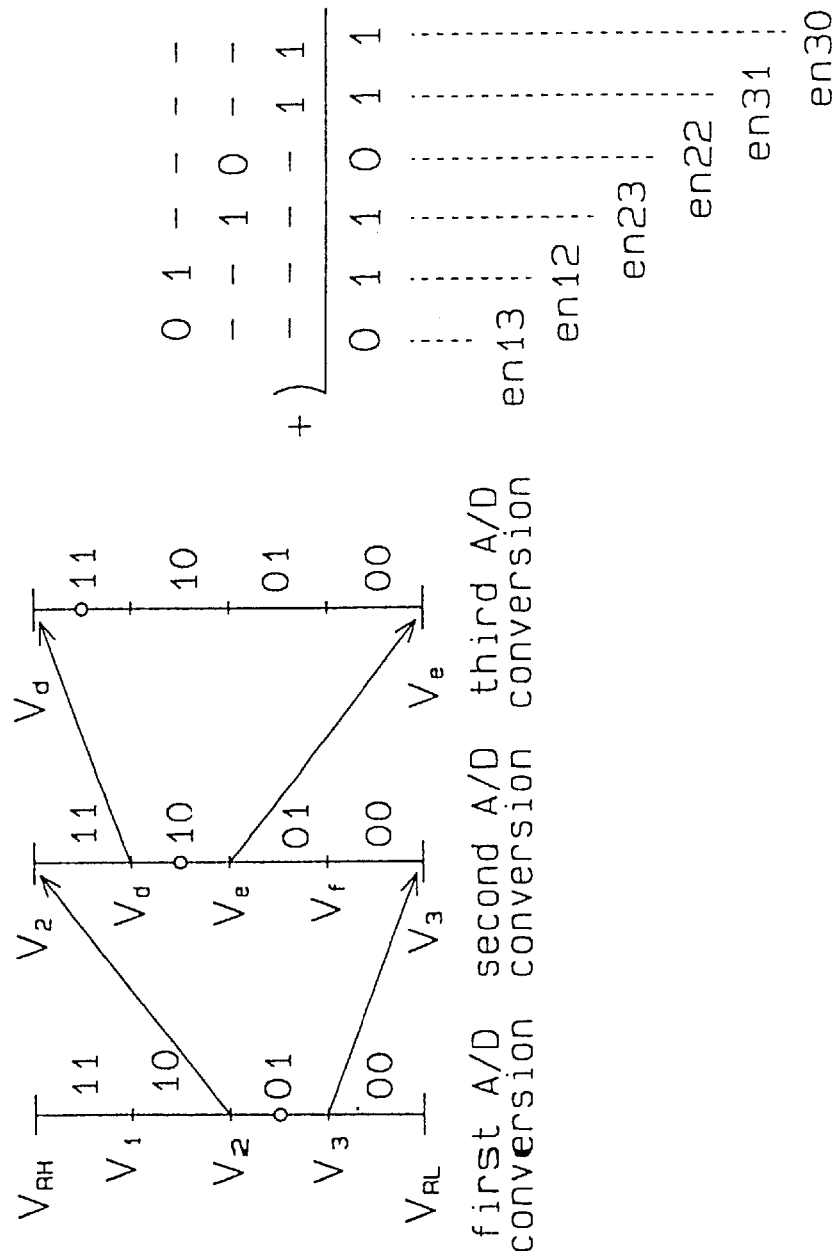
FIG. 19 is an explanatory diagram illustrating the function of this embodiment.

The function of this embodiment will now be described referring to FIG. 19. According to this embodiment, the 6-bit A/D conversion of the analog input signal $A_{in}$ is conducted in three operations, two bits in each operation, starting from the most significant bit (MSB). The first A/D conversion is executed by the comparators 15 to 12 and the first encoder 41, yielding the upper 2-bit digital output en13, en12. When the analog input signal $A_{in}$ belongs to the large-level region ranging from the reference voltage V2 to V3, the output signals CM15 and CM14 of the comparators 15 and 14 both become an L level or "0" and the output signal CM13 of the comparator 13 becomes an H level or "1". Based on the individual output signals CM15, CM14 and CM13, the first encoder 41 determines that the analog input signal $A_{in}$ belongs to the large-level region of V2 to V3, and outputs the digital output en13 of "0" and the digital output en12 of "1" as shown in FIG. 5. Based on this upper 2-bit digital output en13, en12, the switch control circuit 90 closes the switches $S_{C5}$ to $SC_{C9}$ corresponding to the large-level region (between reference voltages V2 and V3) of the analog input signal $A_{in}$ as shown in FIG. 16.

The second A/D conversion is executed by the comparators 23 to 25 and the second encoder 51, yielding the middle 2-bit digital output en23, en22. When the analog input signal $A_{in}$ belongs to the middle-level region of between the reference voltages Vd and Ve, the output signal CM23 of the comparator 20 becomes an L level or "0" and the output signals CM24 and CM25 of the comparators 24 and 25 become an H level or "1". Based on the individual output signals CM23, CM24 and CM25 and the digital output en12, the second encoder 51 determines that the analog input signal $A_{in}$ belongs to the middle-level region of Vd to Ve, and outputs the digital output en23 of "1" and the digital output en22 of "0" as shown in FIG. 7. Based on this middle 2-bit digital output en23, en22, and the digital output en12, the switch control circuit 100 closes the switches $S_{F1}$ and $S_{F2}$ corresponding to the middle-level region (between reference voltages Vd and Ve) of the analog input signal $A_{in}$ as shown in FIG. 18.

The third A/D conversion is executed by the comparators 30 to 32 and the third encoder 60, yielding the lower 2-bit digital output en31, en30. When the analog input signal $A_{in}$ belongs to the small-level region of the reference voltage Vi or above, the output signals CM30, CM31 and CM32 of the individual comparators 30 to 32 all become "1". Based on the individual output signals CM30, CM31 and CM32 and the digital output en10, the third encoder 60 determines that the analog input signal $A_{in}$ belongs to the medium-level region between Vd and Ve, and outputs the digital output en31 of "1" and the digital output en30 of "1" as shown in FIG. 9. As a result, the analog input signal $A_{in}$ is converted into a 6-bit digital signal having a value of "011011" in accordance with the individual digital outputs en13, en12, en24, en23, en31 and en30.

According to this embodiment, as described above, a 6-bit A/D converter can be constituted of sixteen resistors R, four sets of switches $S_A$ to $S_D$ each consisting of five switches, four sets of switches $S_E$ to $S_H$ each consisting of two switches, for a total of twenty-five switches, nine comparators 15 to 13, 23 to 25 and 30 to 32 and four capacitors C1 to C4. It is apparent that the 6-bit A/D converter of this embodiment can have a significantly smaller circuit scale than the conventional 6-bit 2-step parallel A/D converter.

Since this embodiment needs fewer comparators than the prior art, the consumed power will be reduced. The reduction in the circuit scale and the consumed power would become more prominent as the number of bits of an A/D converter having the structure of this embodiment is increased.

The present invention is not limited to the above-described embodiment, but may be modified in various manners as follows.

1) The capacitors C1 to C4 may be replaced with four resistors having the same resistance. In this case, the series-connected resistors are connected in parallel to the resistors R1, so that the replaced resistors should have a sufficiently large resistance to avoid influencing the resistance of the string resistance R1.

2) In the above embodiment, the third A/D conversion is performed on three bits or more. In this case, the third encoder 60 should be modified to have eight series-connected capacitors instead of the four capacitors C1 to C4 and seven comparators instead of the three comparators 30 to 32. This modification allows the third A/D conversion to be performed on three bits. Accordingly, a total of seven bits can be subjected to A/D conversion in three A/D converting operations. If the third encoder 60 is modified to have sixteen series-connected capacitors replacing the four capacitors C1 to C4 and fifteen comparators replacing the three comparators 30 to 32 in the above embodiment, the third A/D conversion can be performed on four bits. Accordingly, a total of eight bits can be resolved in three A/D converting operations. By increasing the number of bits in the third A/D conversion in this manner, an A/D converter which can perform A/D conversion on a greater number of bits can be accomplished.

Figure 1:
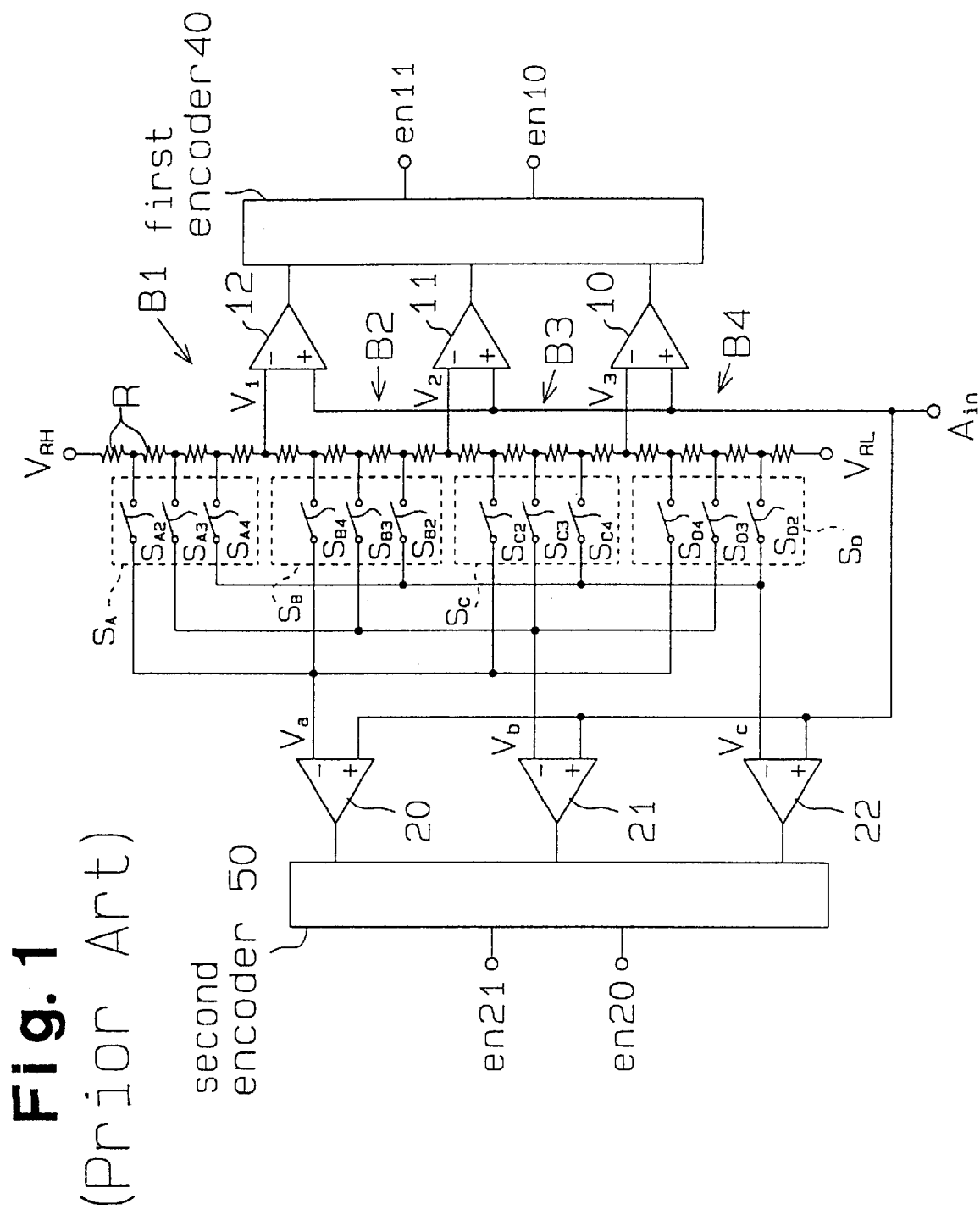
FIG. 1 is a circuit diagram showing a conventional 2-step parallel A/D converter.
Figure 2:
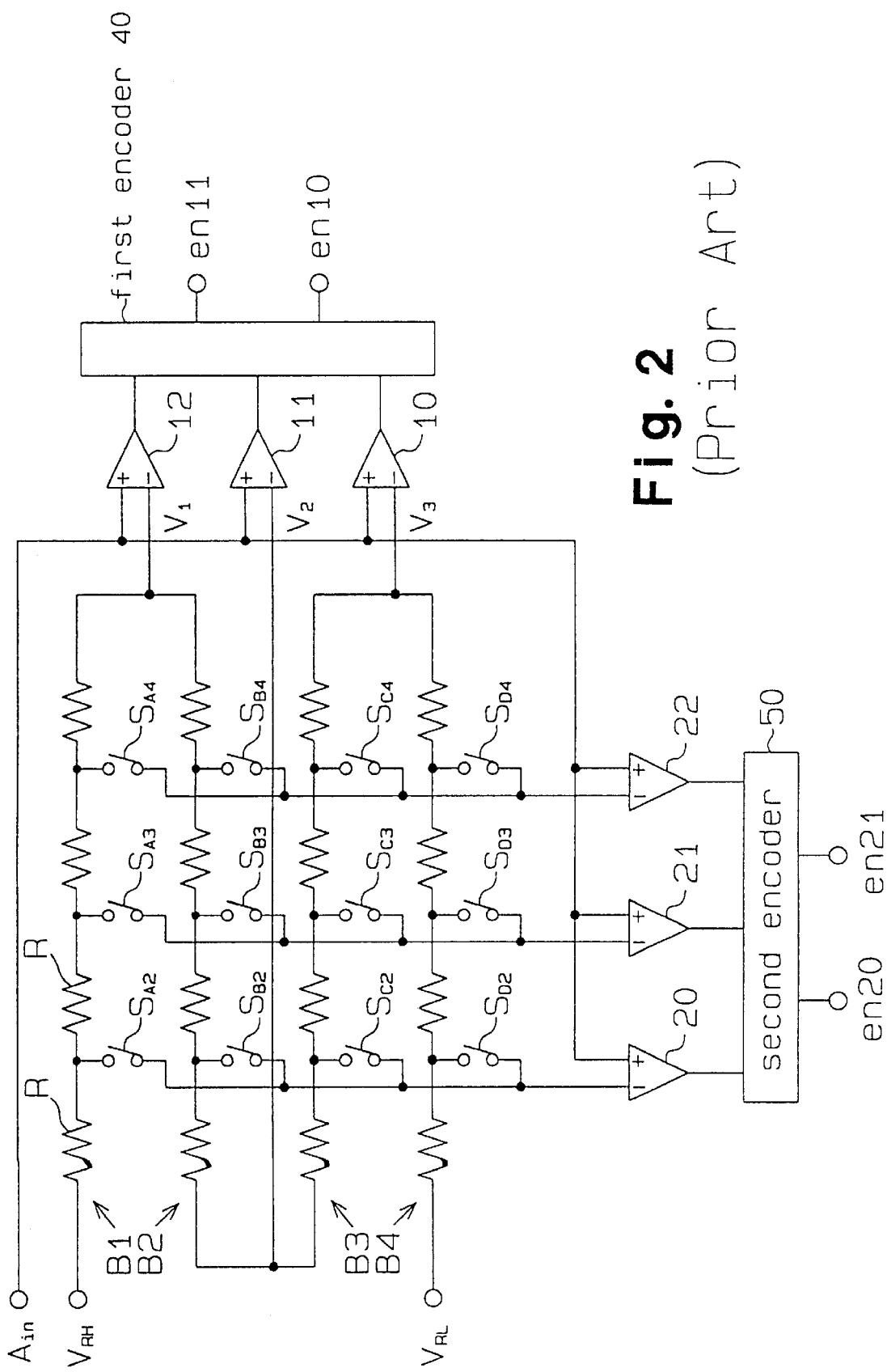
FIG. 2 is a circuit diagram showing the conventional 2-step parallel A/D converter laid out on a semiconductor substrate.
Figure 20:
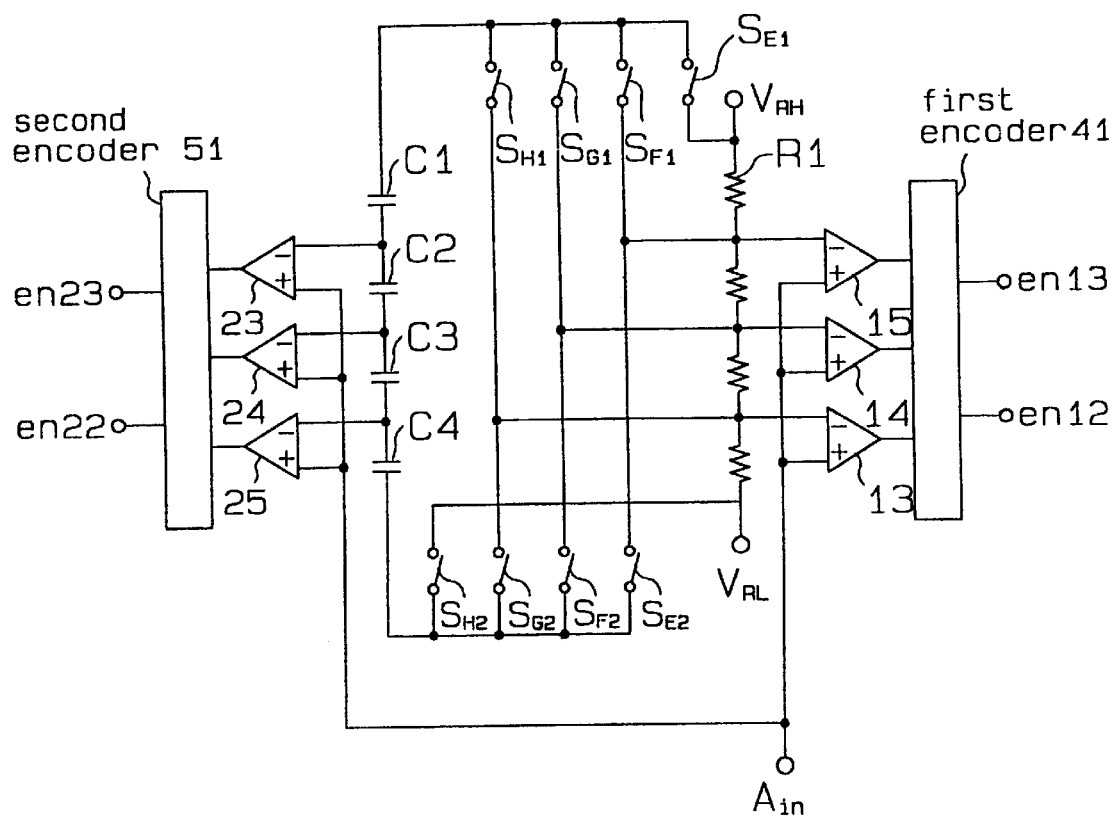
FIG. 20 is a circuit diagram of a 4-bit A/D converter according to another embodiment of this invention.

3) In the above embodiment, the first AD conversion may be combined with the third A/D conversion, thus realizing a 4-bit A/D converter. FIG. 20 presents a circuit diagram of this 4-bit A/D converter. The same reference numerals as used for the embodiment shown in FIG. 3 are given to those identical or corresponding components of this embodiment. In this case, while this embodiment uses the same number of comparators as used in the prior art shown in FIG. 1, the number of the resistors R1 and the number of the switches can be reduced.

4) If the comparators 15 to 13, 23 to 25 and 30 to 32 are given a sample hold function, the sample hold circuit 80 becomes unnecessary.

5) The resistor string consisting of the resistors R may be replaced with a capacitor string consisting of series-connected capacitors having the same capacitance.

6) The above cases (1) to (5) may be combined as needed.

What is claimed is:

1. An A/D converter comprising:
   upper comparison voltage generating means for dividing a reference voltage into a plurality of large-level regions with first voltage-dividing elements and outputting voltages at boundaries of the individual large-level regions as upper comparison voltages;
   a plurality of upper comparators comparing an analog input voltage with said upper comparison voltages;
   upper determining means for determining, from output signals of said upper comparators, to which one of said large-level regions said analog input voltage belongs, wherein said determining means includes first converting means for outputting a predetermined upper digital code in accordance with said determined large-level region;
   middle comparison voltage generating means for dividing said large-level region to which the analog input voltage is determined to belong by said upper determining means, into a plurality of middle-level regions with second voltage-dividing elements and outputting voltages at boundaries of said middle-level regions as middle comparison voltages, the second voltage-dividing elements being commonly used with the first voltage-dividing elements;
   a plurality of middle comparators comparing said analog input voltage with said middle comparison voltages;
   middle determining means for determining, from output signals of said middle comparators, to which one of said middle-level regions said analog input voltage belongs, wherein said determining means includes second converting means for outputting a predetermined middle digital code corresponding to said determined middle-level region;
   lower comparison voltage generating means for dividing said middle-level region to which the analog input voltage is determined to belong by said middle determining means, into a plurality of small-level regions with third voltage-dividing elements and outputting voltages at boundaries of said small-level regions as lower comparison voltages;
   switching means for selectively connecting the lower comparison voltage generating means in parallel to the determined middle-level region by the middle determining means;
   a plurality of lower comparators comparing said analog input voltage with said lower comparison voltages; and
   lower determining means for determining, from output signals of said lower comparators, to which one of said small-level regions said analog input voltage belongs, wherein said determining means further includes a converting means for outputting a predetermined lower digital code in accordance with said determined small-level region, wherein
      said third voltage-dividing elements including one of a capacitor string comprising a plurality of series-connected capacitors and a resistor string comprising a plurality of series-connected resistors, each resistor of the resistor string having a high resistance sufficient to avoid influencing the determined regions of the second voltage-dividing elements.

2. An A/D converter comprising:
   upper comparison voltage generating means for dividing a reference voltage into a plurality of large-level regions with first voltage-dividing elements and outputting voltages at boundaries of the individual large-level regions as upper comparison voltages;
   a plurality of upper comparators comparing an analog input voltage with said upper comparison voltages;
   upper determining means for determining, from output signals of said upper comparators, to which one of said large level regions said analog input voltage belongs, wherein said determining means includes first converting means for outputting a predetermined upper digital code in accordance with said determined large-level region;
   middle comparison voltage generating means for dividing said large-level region to which the analog input voltage is determined to belong by said upper determining means, into a plurality of middle-level regions with second voltage-dividing elements and outputting voltages at boundaries of said middle-level regions as middle comparison voltages, the second voltage-dividing elements being commonly used with the first voltage-dividing elements;

a plurality of middle comparators comparing said analog input voltage with said middle comparison voltages;

middle determining means for determining, from output signals of said middle comparators, to which one of said middle-level regions said analog input voltage belongs, wherein said determining means includes second converting means for outputting a predetermined middle digital code corresponding to said determined middle-level region;

lower comparison voltage generating means for dividing said middle-level region to which the analog input voltage is determined to belong by said middle determining means, into a plurality of small-level regions with third voltage-dividing elements and outputting voltages at boundaries of said small-level regions as lower comparison voltages;

switching means for selectively connecting the lower comparison voltage generating means in parallel to the determined middle-level region by the middle determining means;

a plurality of lower comparators comparing said analog input voltage with said lower comparison voltages; and lower determining means for determining, from output signals of said lower comparators, to which one of said small-level regions said analog input voltage belongs, wherein said determining means further includes a converting means for outputting a predetermined lower digital code in accordance with said determined small-level region, wherein said third voltage-dividing elements including one of a capacitor string comprising a plurality of series-connected capacitors and a plurality of series-connected resistors having the same resistance and a sufficiently large resistance to avoid influencing the resistance of the second voltage-dividing elements.

* * * * *

UNITED STATES PATENT AND TRADEMARK OFFICE
CERTIFICATE OF CORRECTION

PATENT NO. : 6,222,475 B1
DATED : April 24, 2001
INVENTOR(S) : Kouji Okada

It is certified that error appears in the above-identified patent and that said Letters Patent is hereby corrected as shown below:

Title page,
References Cited, please add -- 5,247,301  9/1993  Yahagi et al. --.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*